United States Patent [19]

Mieno et al.

[11] Patent Number: 4,966,861
[45] Date of Patent: Oct. 30, 1990

[54] VAPOR DEPOSITION METHOD FOR SIMULTANEOUSLY GROWING AN EPITAXIAL SILICON LAYER AND A POLYCRYSTALLINE SILICONE LAYER OVER A SELECTIVELY OXIDIZED SILICON SUBSTRATE

[75] Inventors: Fumitake Mieno, Kawasaki; Kazuyuki Kurita; Shinji Nakamura, both of Yokohama; Atuo Shimizu, Kawasaki, all of Japan

[73] Assignee: Fujitsu Limited, Kawasaki

[21] Appl. No.: 344,439

[22] Filed: Apr. 25, 1989

Related U.S. Application Data

[63] Continuation of Ser. No. 105,570, Oct. 8, 1987, abandoned.

[30] Foreign Application Priority Data

| Oct. 8, 1986 | [JP] | Japan | 61-239910 |
| Nov. 20, 1986 | [JP] | Japan | 61-276945 |
| Nov. 20, 1986 | [JP] | Japan | 61-276948 |
| Nov. 20, 1986 | [JP] | Japan | 61-276958 |
| Nov. 20, 1986 | [JP] | Japan | 61-276972 |
| Nov. 26, 1986 | [JP] | Japan | 61-281004 |

[51] Int. Cl.⁵ .................................. H01L 21/20
[52] U.S. Cl. ........................... 437/99; 148/DIG. 17; 148/DIG. 26; 156/613; 437/70; 437/90; 437/939; 437/946; 437/974
[58] Field of Search ............. 148/DIG. 17, 26, 27, 148/29, 50, 115, 122, 135, 164; 156/610–614; 357/49, 55, 59, 60; 437/41, 38, 70, 72, 78, 79, 85, 87, 90, 93, 99, 101, 915, 917, 939, 946, 949, 967, 970, 974

[56] References Cited

U.S. PATENT DOCUMENTS

| 3,600,651 | 8/1971 | Duncan | 357/59 |
| 4,190,949 | 3/1980 | Ikeda et al. | 437/99 |
| 4,462,847 | 7/1984 | Thompson et al. | 437/99 |
| 4,497,683 | 2/1985 | Celler et al. | 156/613 |
| 4,499,657 | 2/1985 | Ooga et al. | 357/59 |
| 4,504,332 | 3/1985 | Shinada | 437/99 |
| 4,522,662 | 6/1985 | Bradbury et al. | 437/89 |
| 4,545,823 | 10/1985 | Drowley | 437/21 |
| 4,578,142 | 3/1986 | Corboy, Jr. et al. | 156/612 |
| 4,579,609 | 4/1986 | Reif et al. | 156/612 |
| 4,592,792 | 6/1986 | Corboy, Jr. et al. | 437/86 |
| 4,637,127 | 1/1987 | Kurogi et al. | 437/90 |
| 4,649,630 | 3/1987 | Boland et al. | 437/66 |
| 4,692,994 | 9/1987 | Moniwa et al. | 437/83 |
| 4,698,316 | 10/1987 | Corboy, Jr. et al. | 437/89 |

OTHER PUBLICATIONS

Sakurai et al., "A New Transistor Structure for High Speed Bipolar LSI", Jn. J. Appl. Phys., vol. 19 supp. 19-1, 1980 pp. 181–185.

Dumin, "Selective Epitaxy Using Silane and Germane" J. Crystal. Growth, vol. 8, 1971, pp. 33–36.

Ghandhi, VLSI Fabrication Processes, John Wiley & Sons, New York, NY, 1983, pp. 517–520.

(List continued on next page.)

*Primary Examiner*—Olik Chaudhuri
*Assistant Examiner*—William Bunch
*Attorney, Agent, or Firm*—Staas & Halsey

[57] ABSTRACT

A method for simultaneously forming an epitaxial silicon layer on a surface of a silicon substrate, and a polysilicon layer on a silicon dioxide ($SiO_2$) layer which is formed on the silicon substrate using a low pressure silicon vapor deposition method, employing silicon hydride gas, particularly disilane ($Si_2O_6$), as a silicon source gas. A crystal growing temperature ranging from 780° C. to 950° C. and a reaction gas pressure ranging from 20 Torr to 300 Torr are desirable. An extended silicon epitaxial region is achieved under a higher temperature and a higher gas pressure, and with a substrate of a (100) orientation. A polysilicon layer having an even surface and joining smoothly to an epitaxial silicon layer which is simultaneously formed, is obtained under a lower temperature and a lower gas pressure, and with a substrate of a (111) orientation.

8 Claims, 6 Drawing Sheets

OTHER PUBLICATIONS

Fisher et al., "Reduced Pressure Epitaxy in an Induction-Heated Vertical Reactor", *Solid State Technology*, Jan. 1986, vol. 29, No. 1, pp. 107–112, Port Washington, NY.

Mieno et al., "Low Pressure Silicon Epitaxy Using $Si_2H_6$", *Conference on Solid State Devices and Materials*, Aug. 1986, pp. 49–52, Tokyo, Japan.

Donahue et al., "Silicon Epitaxy at 650°–800° C. Using Low-Pressure Chemical Vapor Deposition Both With and Without Plasma Enhancement", *Journal of Applied Physics*, Apr. 1985, vol. 57, No. 8, Part 1, pp. 2757–2765, American Institute of Physics, Woodbury, NY.

Atkinson et al., "Submicron Silicon Epitaxial Films Deposited At Low Temperatures", *Journal of the ELectrochemical Society*, Apr. 1985, vol. 132, No. 4, pp. 936–938, Manchester, NH.

VAPOR DEPOSITION METHOD FOR SIMULTANEOUSLY GROWING AN EPITAXIAL SILICON LAYER AND A POLYCRYSTALLINE SILICONE LAYER OVER A SELECTIVELY OXIDIZED SILICON SUBSTRATE

This is a continuation of co-pending application Ser. No. 07/105,570 filed on Oct. 8, 1987, now abandoned.

BACKGROUND OF THE INVENTION

Field of the Invention

The present invention relates to a fabrication method of a semiconductor device having a high speed performance. Particularly, it relates to a vapor deposition method for forming an epitaxial silicon (Si) layer and a polycrystalline silicon layer over a silicon substrate which is partially covered with a silicon dioxide ($SiO_2$) layer.

Description of the Related Art

In the recent LSI technology, reduction of parasitic capacitance of semiconductor devices has been an important factor to obtain a high speed performance of the devices. In a metal-oxide-semiconductor (MOS) field effect transistor (FET), for example, a structure of an elevated source-drain region is adopted. In a bipolar IC, an elevated base contact region made of polycrystalline silicon (hereinafter, referred to as 'polysilicon') is used in order to reduce the capacitance of a base region. A semiconductor device including the above-described MOS FET and bipolar transistor, such as a complementary MOS FET, is also fabricated.

Figure 1:
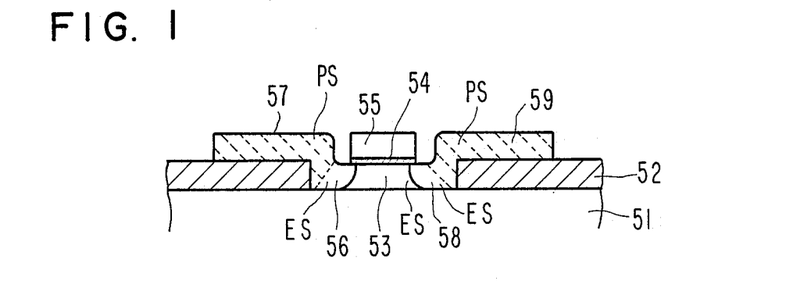
FIG. 1 is a cross-sectional view illustrating a structure of a MOS FET having elevated source-drain regions.

FIG. 1 is a cross-sectional view schematically illustrating a structure of an MOS FET having elevated source-drain regions. In the figure, reference character, 51 designates a $p^-$-type silicon substrate, for example, 52 designates a field oxide insulating layer, 53 designates a p-type channel region, 54 designates a gate insulating layer, 55 designates a gate electrode, 56 designates an $n^+$-type source region, 57 designates an $n^+$-type elevated source region, 58 designates an $n^+$-type drain region, 59 designates an $n^+$-type elevated drain region, ES designates an epitaxial silicon layer, and PS designates a polysilicon layer. In the following figures, like reference numerals and letters designate like parts through all the specification.

Figure 2:
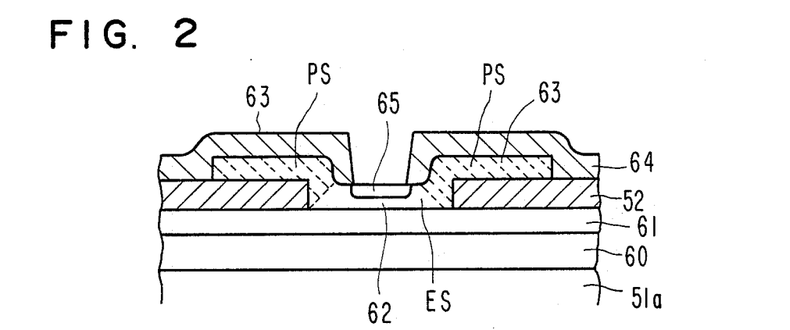
FIG. 2 is a cross-sectional view illustrating a bipolar IC having an elevated base contact region.

FIG. 2 is a cross-sectional view schematically illustrating a bipolar IC having an elevated base contact region. In FIG. 2 reference character, 51a designates a $p^-$-type silicon substrate, 60 designates an $n^+$-type buried layer, 61 designates an $n^-$-type collector region, 62 designates a p-type base region, 63 designates a p-type elevated base contact region, 64 designates an insulating layer, and 65 designates an $n^+$-type emitter region.

In the above semiconductor devices, the channel region 53, the source region 56, the drain region 58, and the base region 62 are formed in the epitaxial silicon layer ES, and the elevated source region 57, the elevated drain region 59, and the elevated base contact region 63 are formed on the polysilicon layer PS which is formed over the field oxide insulating layer 52. In a fabrication step of the devices, it is desirable that both of the epitaxial silicon layer ES and the polysilicon layer PS are simultaneously grown, respectively on the silicon substrate 51 or 51a and on the field oxide insulating layer 52.

Figure 3:
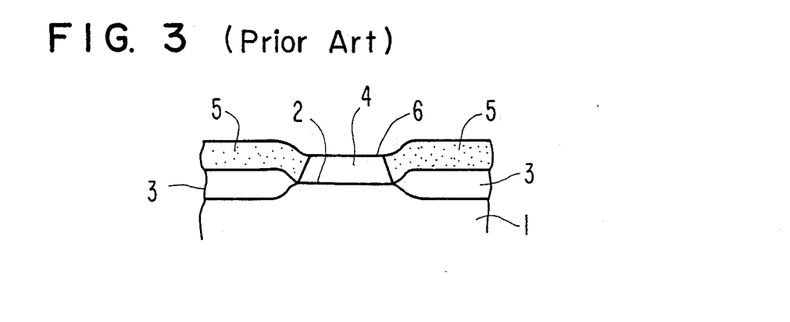
FIG. 3 is a cross-sectional view of a semiconductor device in a prior art silicon vapor deposition stage.

FIG. 3 is a cross-sectional view of a semiconductor device in the above fabrication stage, illustrating a substantially schematic structure thereof. A polysilicon layer 5 is formed on a field oxide insulating layer 3 of silicon dioxide ($SiO_2$) which is disposed on a silicon substrate 1, and an epitaxial silicon layer 4 having a top surface 6 is formed over an exposed surface 2 of the silicon substrate 1.

Referring to FIG. 3, a prior art vapor deposition technology for simultaneously growing the epitaxial silicon layer 4 and the polysilicon layer 5 over the silicon substrate 1 of the structure shown in the figure is described. In order to form a stable epitaxial silicon layer 4 and a polysilicon layer 5, the surface 2 of the silicon substrate 1 is activated prior to the vapor deposition. The activation process is implemented, for example, by bombarding the associated surface of the substrate with argon ions. The activation is considered to create silicon nuclei in a uniform distribution over the surfaces of the field oxide insulating layer 3 and the exposed silicon substrate 1.

Subsequently, vapor deposition to form the epitaxial silicon layer 4 and the polysilicon layer 5 simultaneously is performed under normal pressure, using a silicon source gas, such as silicon hydride (silane) gas, and a carrier gas such as hydrogen gas. One example of the vapor deposition condition is: gas pressure is normal (760 Torr), crystal growth temperature ranges from 950° C. to 1050° C., the silicon source gas is monosilane ($SiH_4$), and the carrier gas is hydrogen ($H_2$).

Figure 4:
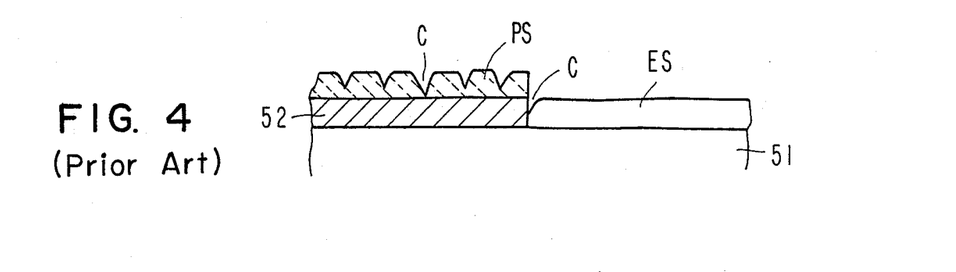
FIG. 4 is a partial cross-sectional view of a polysilicon layer formed using a prior art method, schematically illustrating structural defects thereof.

In the above-described prior art technology, there have been some disadvantages. FIG. 4 is a cross-sectional view, partially illustrating the epitaxial silicon layer ES and the polysilicon layer PS formed on the silicon substrate 51 and the field oxide insulating layer 52 respectively in a silicon vapor deposition step. The boundary surface (transition surface) between the epitaxial silicon layer ES and the polysilicon layer PS is apt to have a discontinuous portion having a sharp V-shaped groove or a crevasse $C_1$, and the polysilicon layer PS formed on the field oxide insulating layer 52 tends to have a substantially rough surface containing a number of granular peaks and deep dimples $C_2$. Such an uneven surface of the polysilicon layer PS causes unstable electrical connection to other circuit elements disposed on the substrate and the associated source region, drain region, or base region, degrading the performance of the device and reducing the fabrication yield of the device.

In another prior art vapor deposition technology, in order to improve the unevenness of the surface of the grown polysilicon layer, the surface of a silicon dioxide ($SiO_2$) layer to be subject to silicon vapor deposition is covered previously by a silicon nitride ($Si_3N_4$) film, whereby the above-described surface activation of the substrate by argon ion bombardment is unnecessary. The silicon vapor deposition gas employed is silane ($SiH_4$) gas. The gas pressure is normal, and the crystal growth temperature is rather high ranging from 1100° C. to 1150° C. The result is favorable. However, this vapor deposition method requires complicated fabrication steps, increasing the fabrication cost, and causing various problems due to the high temperature treatment.

Furthermore, there has been a problem of shrinkage of the epitaxial silicon layer. As shown in FIG. 3, the top surface 6 of the epitaxial silicon layer 4 is shrinked as compared with the bottom surface 2, namely, the originally exposed silicon surface on the silicon substrate 1. As the result, the available active area for a semiconductor device to be formed is reduced, resulting in degrading the integration density of the device, and requiring an undesirable high accuracy of mask alignment in the subsequent fabrication steps. This phenomenon is considered to be caused by a lower growth rate of the epitaxial silicon layer than that of the polysilicon layer.

Before proceeding further, the crystal growth temperature of a silicon vapor deposition process will be described. In general, in a silicon vapor deposition process of a semiconductor device, the crystal growth temperature is desirable to be as low as possible, because high crystal growth temperature causes various problems. For example, in a device shown in FIG. 3, autodoping of the relevant epitaxial silicon layer 4 is caused at a high crystal growth temperature which accelerates diffusion of dopants contained in the silicon substrate 1 into the epitaxial silicon layer 4, altering the dopant density of the epitaxial silicon layer 4. Consequently, the resulting electrical characteristics of the device may be undesirable, reducing the fabrication yield of the device. Meanwhile, in the above-described case where a field oxide insulating layer is formed on a silicon substrate in an earlier stage of the fabrication steps of a semiconductor device, thermal stress generated in a marginal zone along the interface between the field oxide insulating layer 3 and the silicon substrate 1 possibly causes some crystal defects. Subsequent high temperature treatments may increase the thermal stress substantially, further extending the crystal defects in the marginal zone, and thus degrading the quality of the device. In this point of view, reduction of the crystal growth temperature is a key point of the silicon vapor deposition process.

It is well known that a low pressure vapor deposition technique is effective to decrease the crystal growth temperature of the silicon vapor deposition for forming an epitaxial silicon layer on a silicon substrate. E. Krullmann et al., for example, reported in IEEE Transaction On Electron Devices, VOL. ED.29, No.4, Apr., 1982, on pages 491 to 497, that, in a silicon vapor deposition process, by reducing vapor deposition gas pressure from 760 Torr to 40 Torr, the crystal growth temperature could be lowered by approximately 100° C. to 150° C., whereby monosilane ($SiH_4$) and dichlorosilane ($SiH_2Cl_2$) were employed as the silicon source gas.

In a Japanese Laid Open Patent Application, No. 159421/1987, one of the inventors of the present invention and others proposed a vapor deposition method for forming an epitaxial silicon layer over a silicon substrate, utilizing a silicon dioxide ($SiO_2$) layer as a mask, by using disilane ($Si_2H_6$) gas as a silicon source gas. A low crystal growth temperature of 700° C. is obtained under a gas pressure of 3 Torr.

Further, one of the inventors of the present invention and others reported a low pressure vapor phase silicon epitaxy using disilane ($Si_2H_6$) in Extended Abstracts of the 18th International conference on Solid State Devices and Materials, Tokyo, 1986, on pages 49–52. The dissociation energy of the disilane ($Si_2H_6$) is smaller than that of the monosilane ($SiH_4$) gas conventionally used in a silicon vapor deposition. It is considered that the low dissociation energy of the disilane ($Si_2H_6$) serves to provide the dissociated silicon atoms with sufficient energy to migrate over the deposited surface freely. This explains why the disilane ($Si_2H_6$) gas enables the silicon epitaxial growth under a low crystal growth temperature. However, a vapor deposition method for simultaneously forming the epitaxial silicon layer and the polysilicon layer at a low crystal growth temperature has not been realized as yet.

SUMMARY OF THE INVENTION

An object of the present invention is to provide a vapor deposition method for simultaneously forming an epitaxial silicon layer over a surface of a silicon substrate, and a polysilicon layer over a surface of a silicon dioxide ($SiO_2$) layer formed on the silicon substrate.

Another object of the present invention is to provide a silicon vapor deposition method, in the above-described silicon substrate, for obtaining an epitaxial silicon layer and a polysilicon layer, such that both layers are continuously connected to each other, and the polysilicon layer has a favorably even surface, suitable for assuring electrical conductivity of the polysilicon layer, and for forming stacking elements over the polysilicon layer.

Still another object of the present invention is to provide a silicon vapor deposition method, in the above described silicon substrate, for obtaining an epitaxial silicon layer having an extended top surface with a larger area than that of the bottom surface thereof, serving to provide high integration density to the relevant semiconductor device.

A further object of the present invention is to provide a silicon vapor deposition method performable under a low crystal growth temperature, in order to reduce defects caused by a high temperature treatment.

A still further object of the present invention is to provide a simple and non-expensive silicon vapor deposition method for simultaneously forming an epitaxial silicon layer and a polysilicon layer to reduce the fabrication cost of the device.

These objects are achieved by a low-pressure silicon vapor deposition method using disilane gas as a silicon source gas. The relevant vapor deposition condition is to be selected depending on the desired feature of the grown layer. For obtaining an epitaxial silicon layer and a polysilicon layer which are smoothly connected, and for assuring the polysilicon layer has a substantially even top surface, a low gas pressure ranging from 30 Torr to around 100 Torr and a low crystal growth temperature ranging from 780° C. to around 850° C. are desirable. In order to obtain an epitaxial silicon layer having a top surface area larger than that of the bottom surface area, a gas pressure ranging from 30 Torr to 300 Torr, and a crystal growth temperature ranging from 780° C. to 950° C., are desirable.

In the present invention, under the above described vapor deposition conditions, a silicon substrate with (100) orientation is preferable to obtain an epitaxial silicon layer having an extended top surface, and (111) orientated silicon substrate is desirable to obtain an even top surface of the grown layer.

The silicon vapor deposition method of low temperature and low gas pressure is described. These together with other objects, features and advantages of the present invention will be apparent as more fully described and claimed with reference to the accompanying drawings.

BRIEF DESCRIPTION OF THE DRAWINGS

FIG. 5 (a) to (e) are cross-sectional views illustrating a structure of the MOS FET of FIG. 1 in an order of sequential fabrication stages;

DESCRIPTION OF PREFERRED EMBODIMENTS

Figure 6:
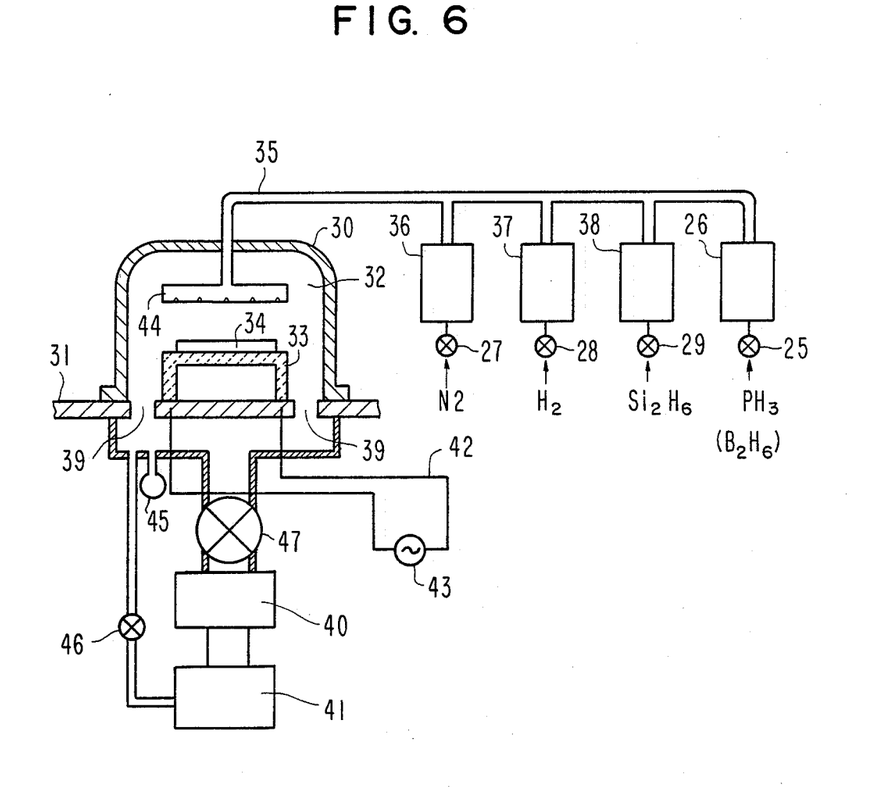
FIG. 6 is a diagram illustrating the system and the structure of a vapor deposition apparatus commonly used in the embodiments.

A vapor deposition apparatus used in the preferred embodiments of the present invention is schematically illustrated in FIG. 6. A reaction chamber 32 comprises a bell jar 30, being vacuum tightly mounted on a metallic base plate 31. The inner diameter of the bell jar 30 is 30 cm and the height is 60 cm. A wafer 34 to be processed is placed on a susceptor (not shown) mounted on a graphite heater 33 which is controllably powered from an electrical power source 43 through wirings 42 to heat the wafer 34. Reaction gas mixture for vapor deposition is introduced into the reaction chamber 32 through a supplying pipe 35, and showered onto the wafer 34 through a perforated head 44. Nitrogen ($N_2$) gas, hydrogen ($H_2$) gas, disilane ($Si_2H_6$) gas, and dopant gas, such as phosphine ($PH_3$) gas for n-type doping, or diborane ($B_2H_6$) gas for p-type doping, are respectively supplied from each gas bottle (not shown), and the supply and the flow rate of each gas is respectively controlled through valves 27, 28, 29, and 25, and mass-flow meters 36, 37, 38 and 26. These gas valves and mass-flow meters are arranged in parallel as represented in FIG. 6. The reaction chamber 32 is evacuated through several pores 39 opened in the base plate 31 by operating a conventional evacuating system connected thereto. The gas pressure inside the reaction chamber 32 is controlled by the evacuation system comprising a mechanical booster pump 40, a rotary pump 41, a vacuum gauge 45, a leak valve 46, and a main vacuum valve 47, arranged as shown in FIG. 6.

A first embodiment wherein the epitaxial silicon and polysilicon layers are grown at a low crystal growth temperature will be explained in the following with reference to FIGS. 5(a) to 5(e). The embodiment of the present invention will be described with respect to an MOS FET having elevated source-drain regions, as shown in FIG. 1. However, it could be understood by those skilled in the art that the disclosed methods described in the following are applicable to other semiconductor devices, such as the bipolar transistor of FIG. 2 and a combined semiconductor device including MOS FETs and bipolar transistors, like a complementary MOS FET (CMOS FET) device.

Figures 5A, 5E:
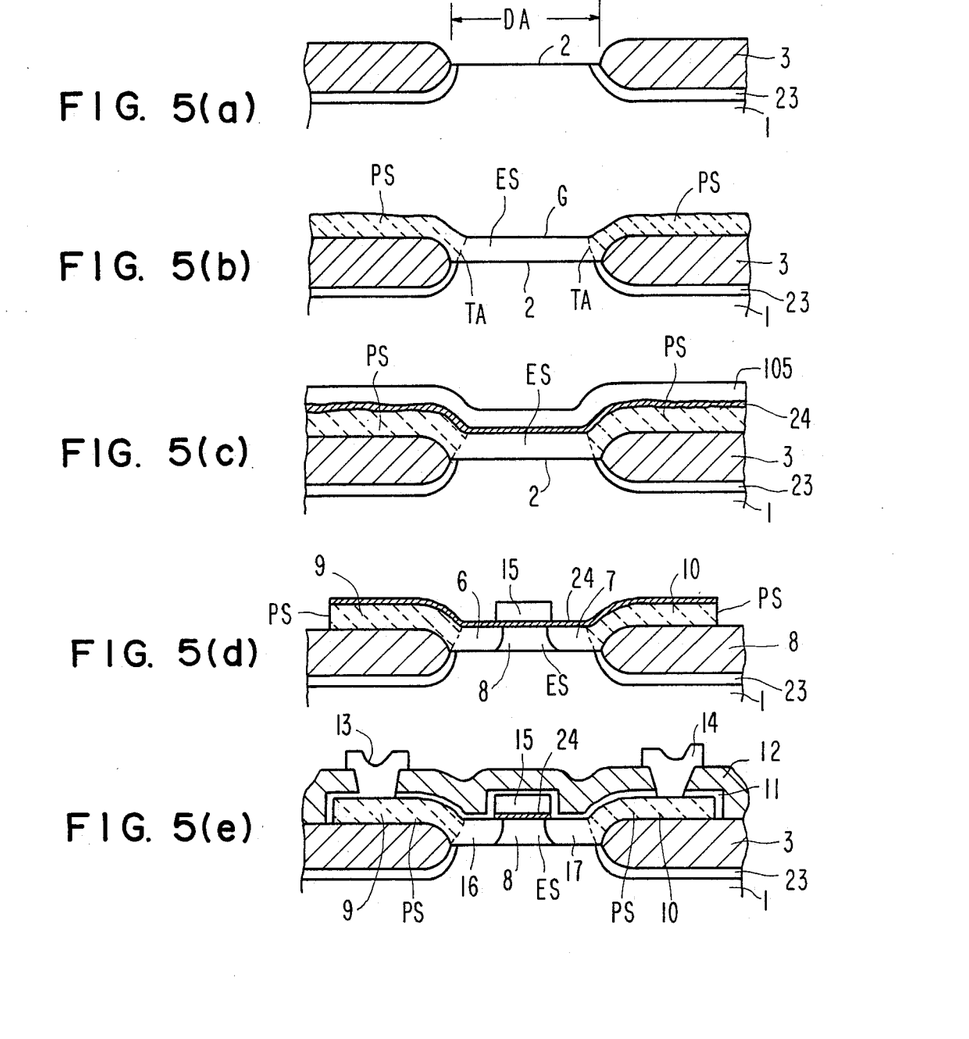

A field oxide insulating layer 3 of silicon dioxide ($SiO_2$) is formed in a silicon substrate 1 of (1 0 0) orientation, employing a selective oxidation (LOCOS) method. The layer 3 may be formed also by utilizing a conventional lithographic technology instead of the LOCOS method. The field oxide insulating layer 3 defines an active area DA for disposing the FET, as shown in FIG. 5(a). Prior to the formation of the field oxide insulating layer 3, dopant ions, such as boron (B) ions, are implanted into the area of the silicon substrate 1 where the field oxide insulating layer 3 is to be formed. The implanted dopants are thermally diffused during the forming process of the field oxide insulating layer 3, forming a p-type channel stopper 23. As is well known, in a mass-production system of semiconductor devices, a number of devices such as MOS FETs are formed on a silicon wafer 34.

The substrate 1 of FIG. 5(a) disposed on the wafer 34 is dipped in a chemical mixed solution containing water ($H_2O$), ammonium hydroxide ($NH_4OH$), and hydrogen peroxide ($H_2O_2$) for ten minutes. Thereafter, the substrate is rinsed in pure water for five minutes and dried. The substrate may further cleaned chemically by dipping it in nitric acid ($HNO_3$) for ten minutes. This removes the native silicon oxide thin film or other undesirable materials formed on the surface of the substrate 1.

Immediately after the chemical processing, the substrate, namely the wafer 34, is loaded within the reaction chamber 32 of the vapor deposition system illustrated in FIG. 6 for preheating followed by a silicon vapor deposition process.

Figure 7:
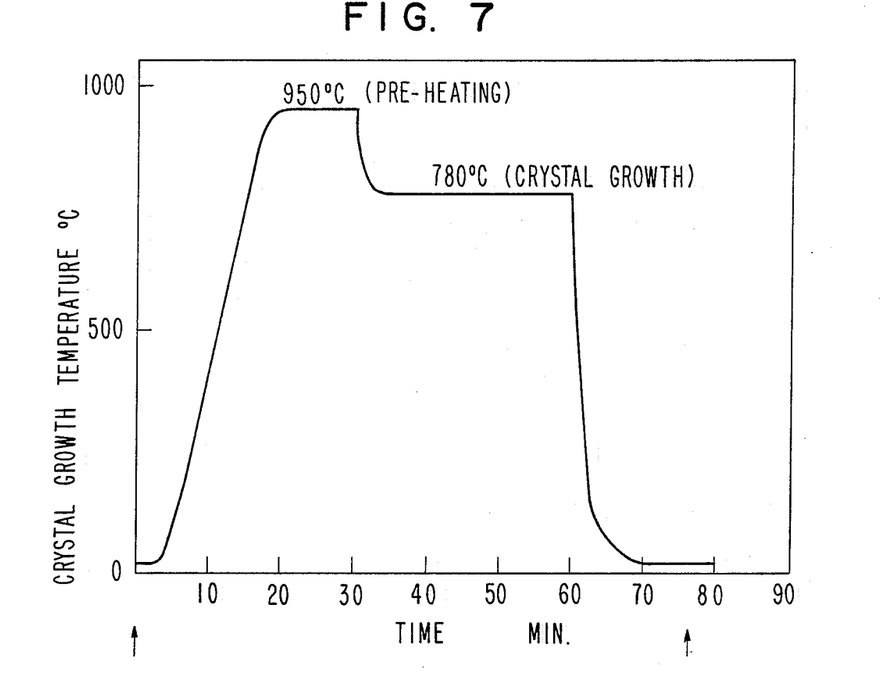
FIG. 7 is a time diagram of the temperature of the wafer under treatment in a vapor deposition step of a first embodiment.
Figure 8:
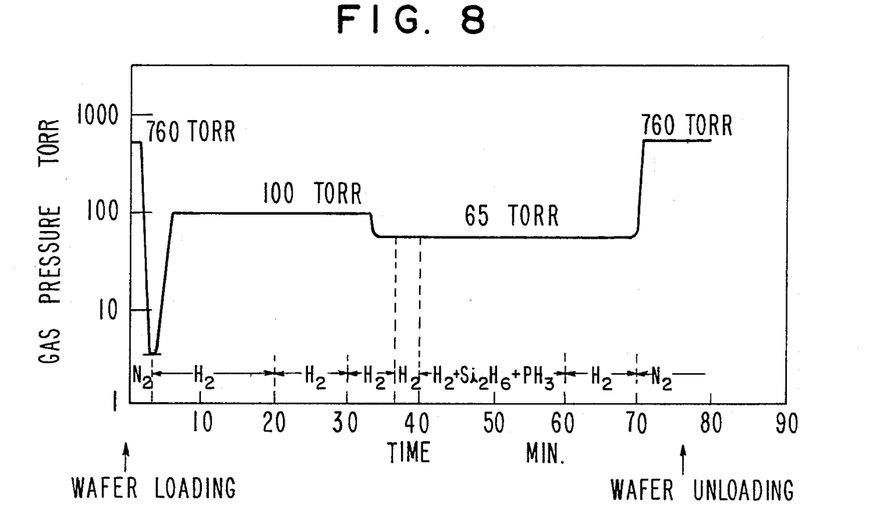
FIG. 8 is a time diagram of the gas pressure inside the relevant reaction chamber in a vapor deposition step.

Referring to FIG. 5(b), FIG. 7 and FIG. 8, the preheating process and the vapor deposition process are described. Both processes are substantially desirable to be started following with the above-described chemical cleaning treatment within a shortest possible time of exposure of the wafer 34 to the environmental atmosphere, particularly, at a low crystal growth temperature such as 780° C. Otherwise, the surface of the wafer 34 may be contaminated by absorption of undesirable gas molecules and formation of native silicon dioxide ($SiO_2$). FIG. 7 and FIG. 8 are time diagrams illustrating respectively the temperature of the wafer 34 under treatment and the gas pressure inside the reaction chamber 32 at each sub-step. The chemically cleaned wafer 34 is loaded in the reaction chamber 32 filled with nitrogen ($N_2$) gas under normal pressure (760 Torr). Then the nitrogen ($N_2$) gas is evacuated by closing the valve 27, and hydrogen (H₂) gas is introduced into the chamber 32 by opening the valve 28. The gas pressure is maintained at 100 Torr, while the graphite heater 33 is powered to raise the temperature of the wafer 34 and maintain the temperature at 950° C. for about 10 minutes for desorption of undesirable gas molecules absorbed on the surface of the wafer 34. Thereafter, the graphite heater 33 is turned down, decreasing the wafer temperature down to 780° C. The hydrogen (H₂) gas is kept flowing for the desorption of undesirable gas absorbed on the wafer 34 for several minutes. Thus the preheating process is completed. The above-described preceding chemical treatment immediately followed by the preheating process eliminates the need of the above-described argon ion bombardment or coverage with a silicon nitride (Si₃N₄) film over the surface of the wafer.

Subsequently, disilane (Si₂H₆) gas and diborane (B₂H₆) gas under respective specified flow rates are supplied to the supplying pipe 35 by opening the relevant valves 29 and 25. The flow rate of each gas is controlled with the associated mass-flow meters 38 and 26, and the gasses are mixed with the hydrogen (H₂) gas, creating a reaction gas mixture. The reaction gas pressure is controlled to 65 Torr by adjusting the evacuating system. The reaction gas is showered onto the wafer 34 through the perforated head 44. Thus, the silicon vapor deposition is implemented over the substrate at 780° C. for 20 minutes. Thereby, a polysilicon layer PS and an epitaxial silicon layer ES of p⁻-type are simultaneously formed over the field insulating layer 3 of silicon dioxide (SiO₂), and the exposed surface of the silicon substrate 1, respectively. Then the reaction gas is exchanged with hydrogen (H₂) gas, and the graphite heater 33 is turned off, decreasing the temperature of the substrate to the room temperature. Next, the hydrogen (H₂) gas is exchanged with nitrogen (N₂) gas under the normal pressure, and the wafer 34 is unloaded from the reaction chamber 32.

The vapor deposition conditions of the above-described embodiment include the crystal growth temperature of 780° C. and the reaction gas pressure of 65 Torr. As will be described later, a reaction gas pressure ranging from 30 Torr to 300 Torr and a crystal growth temperature ranging from 780° C. to 950° C. are desirable for simultaneous deposition of the epitaxial layer and the polysilicon layer. The resulting epitaxial silicon layer ES and polysilicon layer PS are adjoined closely to each other, and the surface of the marginal region along the interface between the polysilicon layer PS and the epitaxial silicon layer ES is favorably even. Further, the surface of the polysilicon layer PS is also favorably smooth. In addition, the low crystal growth temperature eliminates various crystal defects particularly generated in the marginal region along the interface.

FIG. 5(c) illustrates the structure of the MOS FET in the next step. A gate insulating film 24 of silicon dioxide (SiO₂) having a thickness of 300 Å is formed over the entire surface of the substrate, being followed by the formation of a polysilicon layer 105 having a thickness of 4000 Å, employing a conventional chemical vapor deposition (CVD) technology over the gate insulating film 24. Then, the polysilicon layer 105 is doped to have high electrical conductivity, being patterned using a lithographic technology to form a gate electrode 15 as shown in FIG. 5(d). Next, the substrate is exposed to the ion bombardment of arsenic (As) ions of high density utilizing the gate electrode 15 as a mask. The arsenic (As) ions are implanted into the epitaxial silicon layer ES and the polysilicon layer PS through the gate insulating film 24, and thermally diffused therein, converting the epitaxial silicon layer ES and the polysilicon layer PS to n⁺-type layer. Thereafter, both layers are patterned using a conventional lithographic technology. Thus, an n⁺-type source region 16, an n⁺-type drain region 17, and a p⁻-type channel region 8 are formed in the epitaxial silicon layer ES, and an n⁺-type elevated source region 9 of polysilicon and an n⁺-type elevated drain region 10 of polysilicon are formed in the polysilicon layer PS as shown in FIG. 5(d). Stable electrical connections between the source region 16 and the elevated source region 9 and between the drain region 17 and the elevated drain region 10 are thus obtained.

Next, in a conventional manner, the exposed gate insulating film 24 of silicon dioxide (SiO₂) is removed using a lithographic technology, and a blocking layer 11 of silicon dioxide (SiO₂) is selectively formed over the surface except for the exposed surface of the field insulating layer 3. Then over the entire surface of the substrate, a phospho-silicate-glass (PSG) layer 12 is formed by a conventional CVD method, in which contact windows are opened over the elevated source region 9 and the elevated drain region 10 such that surfaces of the regions 9 and 10 are exposed at the bottom of the windows. Thereafter, an aluminum source wiring 13 and an aluminum drain wiring 14 are formed on the PSG layer 12, contacting respectively to the exposed source region 9 and the drain region 10 through the windows. Finally, a passivation layer (not shown) is formed over the entire surface of the substrate to complete an MOS FET having an elevated source-drain regions as shown in FIG. 5(e).

Figure 9:
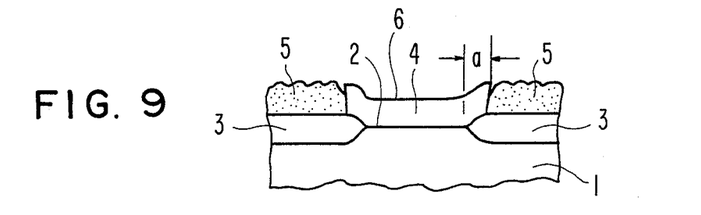
FIG. 9 is a schematic cross-sectional view, illustrating the structure of a substrate being subject to a silicon vapor deposition of a second embodiment.

In a second embodiment of the present invention, a simultaneous silicon layer ES and a polysilicon layer PS at a high crystal growth temperature of 940° C. is described. In this embodiment, all the conditions for the silicon vapor deposition, except for the crystal growth temperature, are the same as those of the first embodiment. The vapor deposition is performed at 940° C. FIG. 9 is a substantially schematic view of a substrate being subject to a silicon vapor deposition under the above vapor deposition condition. An epitaxial silicon layer 4 of 0.6 μm thickness is grown on the silicon substrate 1, and a stable polysilicon layer 5 of 0.6 μm thickness, is formed on the field insulating layer 3. The depth of dimples formed on the surface 5a of the polysilicon layer 5 and the depth of a crevasse between the epitaxial layer 4 and the polysilicon layer 5 are small, distributing below about 0.15 μm. The surface 6 of the epitaxial silicon layer 4 is substantially smooth. The epitaxial silicon layer 4 is laterally extended as shown in FIG. 9, having area of the top surface 6 larger than that of the bottom surface 2. Under the above-described vapor deposition condition, the lateral extending length a of the top surface 6 reaches approximately 0.4 μm. Generally, the increase in crystal growth temperature of silicon vapor deposition raises the silicon crystal growth rate to enhance the lateral extension of the grown epitaxial silicon layer. However, at a high crystal growth temperature, as already described above and schematically represented in FIG. 4, the surface of the grown polysilicon layer is roughened, and the depth of the dimples is deepened. A crystal growth temperature exceeding 950° C., therefore, is not practical.

Figure 10:
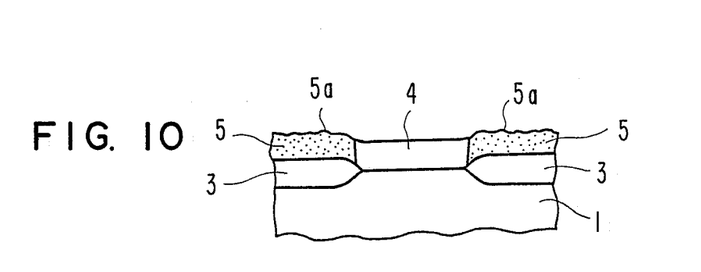
FIG. 10 is a schematic cross-sectional view, illustrating the structure of a substrate being subject to a silicon vapor deposition of a third embodiment.

In a third embodiment of the present invention, the simultaneous deposition of the epitaxial silicon layer and the polysilicon layer is performed using a (1 1 1) oriented silicon substrate. All the conditions except substrate orientation are the same as those of the second embodiment. Simultaneously, an epitaxial silicon layer 4 of 0.5 μm thickness is formed on an exposed silicon surface 2 of the silicon substrate 1, and a polysilicon layer 5 of 0.4 μm thickness on the field oxide layer 3 as shown in FIG. 10. The surface 5a of the polysilicon layer 5 is fairly smooth having a depth of dimples below 0.15 μm. In addition, a crevasse in the interface between the epitaxial silicon layer 4 and polysilicon layer 5 is almost non-existent. When a semiconductor device having a multi-layered structure is formed, a silicon substrate having (1 1 1) orientation is desirable to be used. On the other hand the lateral extension of the epitaxial silicon layer 4 is rather small, almost zero.

As a fourth embodiment of the present invention, an experiment was performed to examine the influence of the crystal growth temperature and the substrate orientation on the lateral extension of an epitaxial silicon layer grown thereby. The silicon vapor deposition experiments were performed using (1 0 0) oriented and (1 1 1) oriented silicon substrates under a constant gas pressure of 60 Torr, and at three crystal growth temperatures, 800° C., 900° C., and 940° C. The results are represented in FIG. 11.

Figure 11:
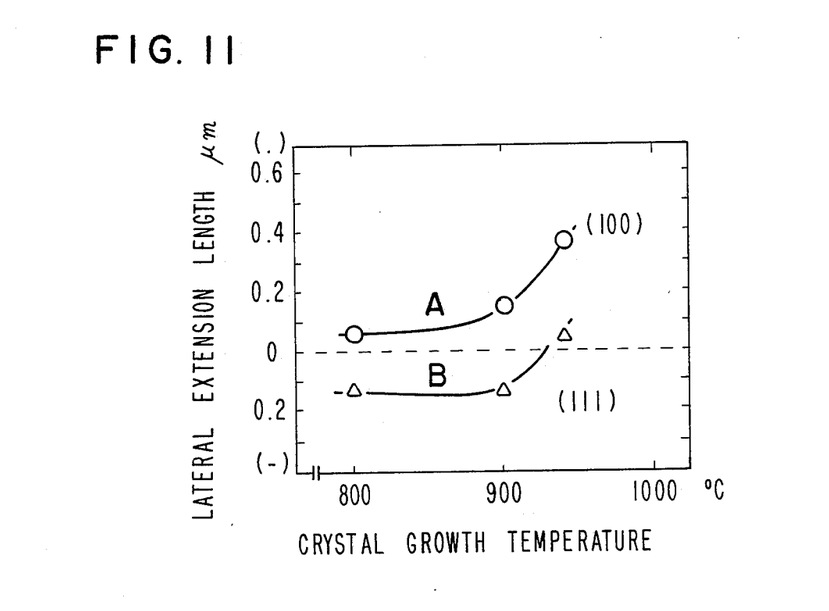
FIG. 11 is a diagram illustrating the relationship between the crystal growth temperature and the lateral extension length of the grown epitaxial silicon layer under a reaction gas pressure of 60 Torr.

As shown by curves A and B which illustrate lateral length on substrate orientations as (100) and (111) respectively in FIG. 11, corresponding to the orientation of the silicon substrate, the lateral extension length a increases with the crystal growth temperature. However, the curve A, corresponding to (1 0 0) orientation, has a changeover point at around 850° C. At a lower temperature, almost a constant extension length is provided, however, at temperatures exceeding approximately 850° C., the extension length increases with the temperature. With respect to a silicon substrate having (1 1 1) orientation, the lateral length has a negative value below around 930° C., as shown by the curve B. It is obvious that a silicon substrate oriented (1 0 0) is more suitable when high integration density is required for the relevant MOS FET device.

As a fifth embodiment, there will be described an experiment which was implemented by varying reaction gas pressure under a fixed crystal growth temperature of 940° C. Thereby, the relationship between the gas pressure and the depth of the dimples formed in a vapor deposited polysilicon layer, such as shown in FIG. 4, and that between the gas pressure and the lateral extension of the epitaxial silicon layer, were observed. The roughness of the polysilicon layer having a thickness of 1.0 μm, was measured with a roughness-meter, a product of Tencor Co., branded as 'Alpha-Step', employing a tracer method. The result is represented in a diagram of FIG. 12. With an increase in the gas pressure, the depth of the dimples increases. The depth is favorably small, below 0.2 μm, under a low gas pressure lower than around 100 Torr. Over a gas pressure of 300 Torr, the depth of the dimples exceeds 0.6 μm. With a high gas pressure, dissociated silicon atoms appear to coagulate to a few silicon nuclei, forming a rough surface of the polysilicon layer. Real depth of the dimple, or the crevaase, between polysilicon granules, seems to be deeper than the measured value, because the point of a tracing needle may not be able to reach the bottom of the crevasse. A gas pressure exceeding 300 Torr, therefore, is not applicable to the silicon vapor deposition of a polysilicon layer of the above-described device. However, a gas pressure lower than 30 Torr is not applicable to obtain a stable and smooth polysilicon layer, because the silicon crystal growth is inactive and island-like deposited silicon granules are dispersed over the surface of the subject silicon dioxide ($SiO_2$) layer. A gas pressure ranging from 30 Torr to 300 Torr, therefore, is desirable to obtain a stable polysilicon layer. As the result, when a multi-layered structure is adopted in the relevant semiconductor device, a lower crystal growth temperature, ranging from 30 Torr to around 100 Torr, is suitable, because a smooth surface is provided to the grown polysilicon layer. On the other hand, when high integration density is required to the relevant semiconductor device, then a relatively higher gas pressure near 300 Torr is suitable, because a fairy extended top surface is provided to the grown epitaxial silicon layer as described next.

Figure 13:
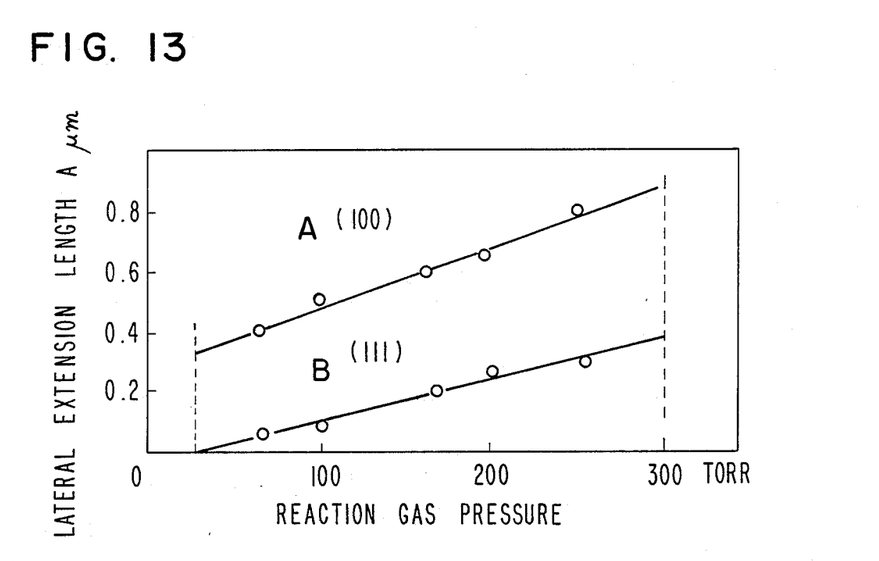
FIG. 13 is a diagram illustrating the relationship between the reaction gas pressure and the lateral extension length of an epitaxial silicon layer of the grown epitaxial silicon layer under a crystal growth temperature of 940° C.

FIG. 13 is a diagram illustrating the relationship between the reaction gas pressure and the lateral extending length of the epitaxial silicon layer under a crystal growth temperature of 940° C. As shown by curves A and B, which represent silicon substrate orientations (100) and (111) respectively in FIG. 13, the lateral extension is increased with the gas pressure with respect to both a silicon substrate of (1 0 0) orientation and that of (1 1 1) orientation. From the curves, it is obvious that the silicon substrate having (1 0 0) orientation is more suitable to obtain a high lateral extension. However, the gas pressure is limited by the upper limit of the gas pressure of 300 Torr as described above.

Figure 12:
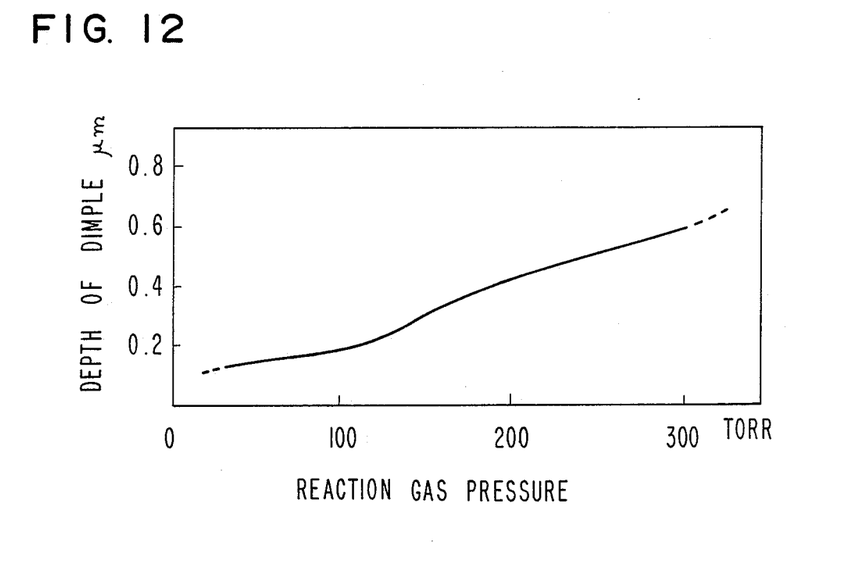
FIG. 12 is a diagram illustrating the relationship between the reaction gas pressure and the depth of dimples formed on a polysilicon layer under a crystal growth temperature of 940° C.

Considering the results represented in FIG. 11, FIG. 12, and FIG. 13, a higher crystal growth temperature and a higher gas pressure within the respective upper limit are desirable for manufacturing a high integration density semiconductor device.

However, a lower crystal growth temperature and a lower reaction gas pressure are desirable for manufacturing a semiconductor device in which a complicated structure is further formed over the polysilicon layer grown by the vapor deposition method of the present invention, such as a multi-layered IC device.

What we claim is:

1. A method for fabricating a semiconductor device, comprising:
    (a) implanting dopant ions into an area of the silicon substrate;
    (b) forming a field oxide insulating layer on the ion implanted area of the silicon substrate, said insulating layer having an active area;
    (c) cleaning the substrate by dipping in a cleaning solution;
    (d) placing the silicon substrate in a reaction chamber;
    (e) preheating the silicon substrate in the reaction chamber to effect desorption of gas molecules absorbed on the silicon substrate in a hydrogen ambient;
    (f) introducing a reaction gas containing silicon hydride into the reaction chamber at a pressure in a range from 30–300 torr, while heating the silicon substrate at a temperature in a range from 780° C.–950° C., thereby simultaneously forming a polysilicon layer PS and an epitaxial silicon layer ES over the field oxide insulating layer, with the PS and ES layers being closely and smoothly adjoined to each other at an interface therebetween.

2. A method of claim 1, wherein said silicon hydride gas is disilane ($Si_2H_6$) gas.

3. A method of claim 2, wherein said silicon substrate has a major surface of (1 0 0) orientation, thereby an extended top surface of said epitaxial silicon layer having a wider area than that of the bottom surface of said epitaxial silicon layer is obtained.

4. A method of claim 2, wherein said silicon substrate has a major surface of (1 1 1) orientation, thereby a smooth surface of said polycrystalline silicon layer is obtained.

5. A method of claim 1, wherein said semiconductor device is an MOS field effect transistor.

6. A method of claim 1, wherein said semiconductor device is a bipolar transistor.

7. A method of claim 1, wherein said semiconductor device is a semiconductor device comprising an MOS field effect transistor and a bipolar transistor.

8. A method of claim 1 further comprising the step of sputtering the surface of said silicon substrate and said silicon dioxide ($SiO_2$) layer by using ions between said steps (d) and (e).

* * * * *